(12) United States Patent
Tseng et al.

(10) Patent No.: US 7,170,329 B2
(45) Date of Patent: Jan. 30, 2007

(54) CURRENT COMPARATOR WITH HYSTERESIS

(75) Inventors: Yuh-Kuang Tseng, Tao-Yuan Hsien (TW); Ming-Shih Yu, Taipei Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 24 days.

(21) Appl. No.: 10/904,700

(22) Filed: Nov. 23, 2004

(65) Prior Publication Data

US 2006/0109041 A1    May 25, 2006

(51) Int. Cl.
*H03K 3/00* (2006.01)
(52) U.S. Cl. ........................... 327/205; 327/206
(58) Field of Classification Search ................ 327/205, 327/206, 74–76
See application file for complete search history.

(56) References Cited

U.S. PATENT DOCUMENTS 4,503,340 A * 3/1985 Linder ........................ 327/72
5,170,076 A * 12/1992 Smith ......................... 327/74
5,514,987 A * 5/1996 Ramirez ..................... 327/74
6,121,913 A * 9/2000 Glass et al. ................ 341/159
6,307,405 B2  10/2001 Forbes et al. ............... 327/54

* cited by examiner

*Primary Examiner*—Kenneth B. Wells
(74) *Attorney, Agent, or Firm*—Winston Hsu

(57) ABSTRACT

A hysteresis current comparator includes a first current comparison unit, a second current comparison unit, and a control circuit connected to the two current comparison units. The first current comparison unit compares a first reference current with an input current and outputs a first voltage accordingly. The second current comparison unit compares a second reference current with the input current and outputs a second voltage accordingly. The control circuit generates an output voltage according to the voltages output by the two current comparison units, or generates an output voltage according to the voltages output by the two current comparison units and the output voltage of the control circuit at a former state.

2 Claims, 5 Drawing Sheets

|         | V1 | V2 | V3 | Vo |
|---------|----|----|----|----|
| State 1 | H  | H  | L  | H  |
| State 2 | L  | H  | L  | H  |
| State 3 | L  | L  | H  | L  |
| State 4 | L  | H  | H  | L  |

Fig. 5

CURRENT COMPARATOR WITH HYSTERESIS

BACKGROUND OF INVENTION

1. Field of the Invention

The present invention relates to a current comparator with hysteresis, and more particularly, to a current comparator capable of determining transition points in a hysteresis curve.

2. Description of the Prior Art

Please refer to FIG. 1, which shows circuitry of a hysteresis current comparator 10 according to the prior art. The current comparator 10 includes five NMOS transistors M1, M2, M5, M6 and M8, and three PMOS transistors M3, M4 and M7.

Transistors M1 and M2 are driven by the voltage of a node N1 through the gates. Transistors M5 and M6 of the hysteresis current comparator 10 are regarded as a current sink, driven by the voltage of a node N2 through the gates. The drains of transistors M1 and M3 are connected to a node N3. In addition, the node N3 connected to the drains of transistors M1 and M3 is further connected to the gates of transistors M3 and M4.

Similarly, the drains of transistors M2 and M4 are connected to a node N4, which is further connected to the gates of transistors M7 and M8. Additionally, the two inputs of the current comparator 10, nodes N5 and N6, are respectively connected to the sources of transistors M1 and M2. The output of the current comparator 10 is connected to the node N4. The sources of transistors M3 and M4 are connected to a voltage source Vdd, and so are the drain of transistor M8 and the source of transistor M7. The drain of transistor M7 is connected to the node N5 and the source of transistor M8 is connected to the node N6. In FIG. 1, the input current I1 passes through the node N5 while a reference current I2 passes through the node N6.

Please refer to FIG. 2, which is a graph of current vs. voltage for the circuit in FIG. 1. Transistors M7 and M8 and the reference current I2 control the hysteresis curve of the current comparator 10. Please refer to FIG. 1 again. When the output voltage Vout is at low level, transistor M7 is driven so that the output current IM7 of transistor M7 passes through the node N5. In the same time, the input current I1 also passes through the node N5 and thereby transfers the output voltage Vout of the current comparator 10. At this moment, the output voltage Vout is $(-Zv((I1+IM7)-I2))$. The output voltage Vout is transferred to high level only when the value of $((I1+IM7)-I2)$ is negative. Conversely, when the output voltage Vout is high, transistor M8 is driven so that the input current IM8 passes through the node N6 while the reference current I2 passes through the node N6 and thereby changes the output voltage Vout of the current comparator 10. At this moment, the output voltage Vout is $(-Zv(I1-(I2+IM8)))$. The output voltage Vout is transferred to low level only when the value of $(I1-(I2+IM8))$ is positive.

When transistor N7 is turned on and the value of $((I1+IM7)-I2)$ is negative, the output voltage Vout will be transferred from low to high level at a transition point a. On the contrary, when transistor M8 is driven and the value of $(I1-(I2+IM8))$ is positive, the output voltage Vout is transferred from high to low level at a transition point b. Therefore, in FIG. 2, the positions of the transition points a and b are respectively controlled by transistors M7 and M8. However, transistors M7 and M8 are different types of transistors. Transistor M7 is a PMOS transistor while transistor M8 is an NMOS transistor. During manufacture, it is difficult to control the parameters of transistors M7 and M8 to determine the positions of the transition points a and b and thereby the hysteresis curve of the current comparator 10 is not as expected. For example, suppose that the required hysteresis curve is a curve in which the reference current I2 is zero and the transition points a and b are respectively −200 uA and 200 uA. However, due to process variations, the transition points a and b might shift, the transition point a shifting to −230 uA and the transition point b shifting to 210 uA. Therefore, we cannot get the required hysteresis curve mentioned above.

SUMMARY OF INVENTION

It is therefore a primary objective of the claimed invention to provide a hysteresis current comparator to solve the above-mentioned problem.

The claimed invention discloses a hysteresis current comparator. The hysteresis current comparator comprises a first current comparison unit for comparing a first reference current with an input current, and outputting a first voltage accordingly; a second current comparison unit for comparing a second reference current with the input current, and outputting a second voltage accordingly; and a control circuit connected to the first and second current comparison units for generating an output voltage according to the first and second voltages, or generating an output voltage according to the first and second voltages and the output voltage of the control circuit at a former state.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5 is a table of voltages of FIG. 3.

DETAILED DESCRIPTION

Figure 1:
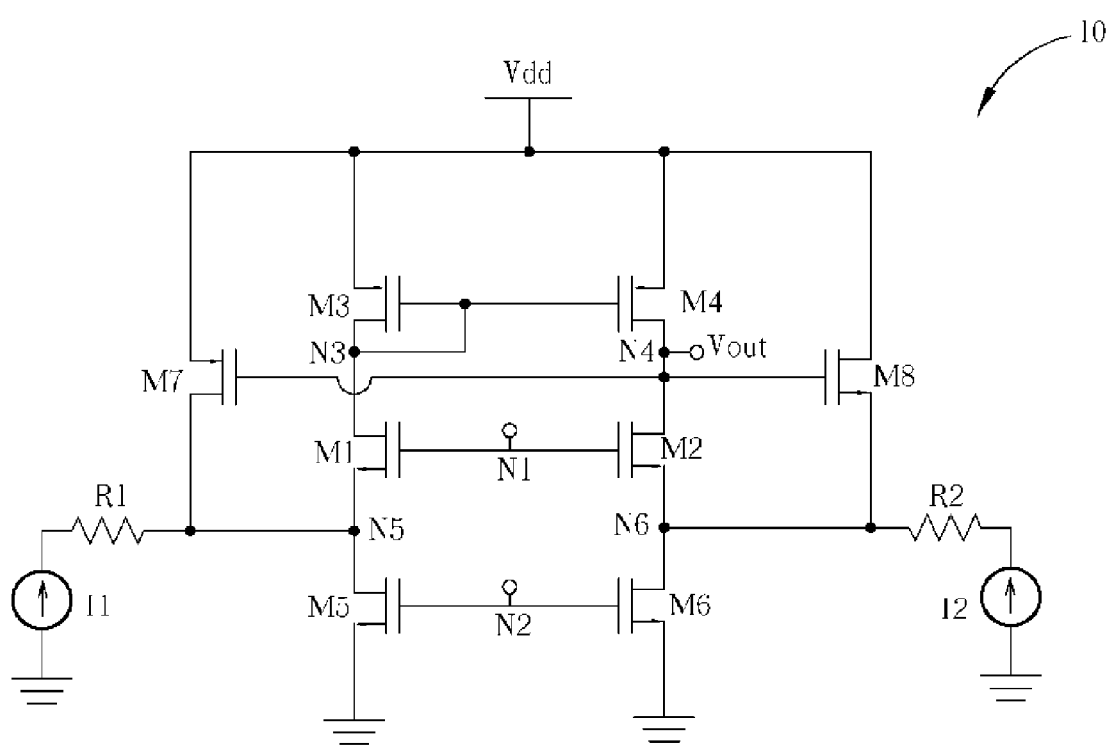
FIG. 1 shows circuitry of a hysteresis current comparator according to the prior art.
Figure 2:
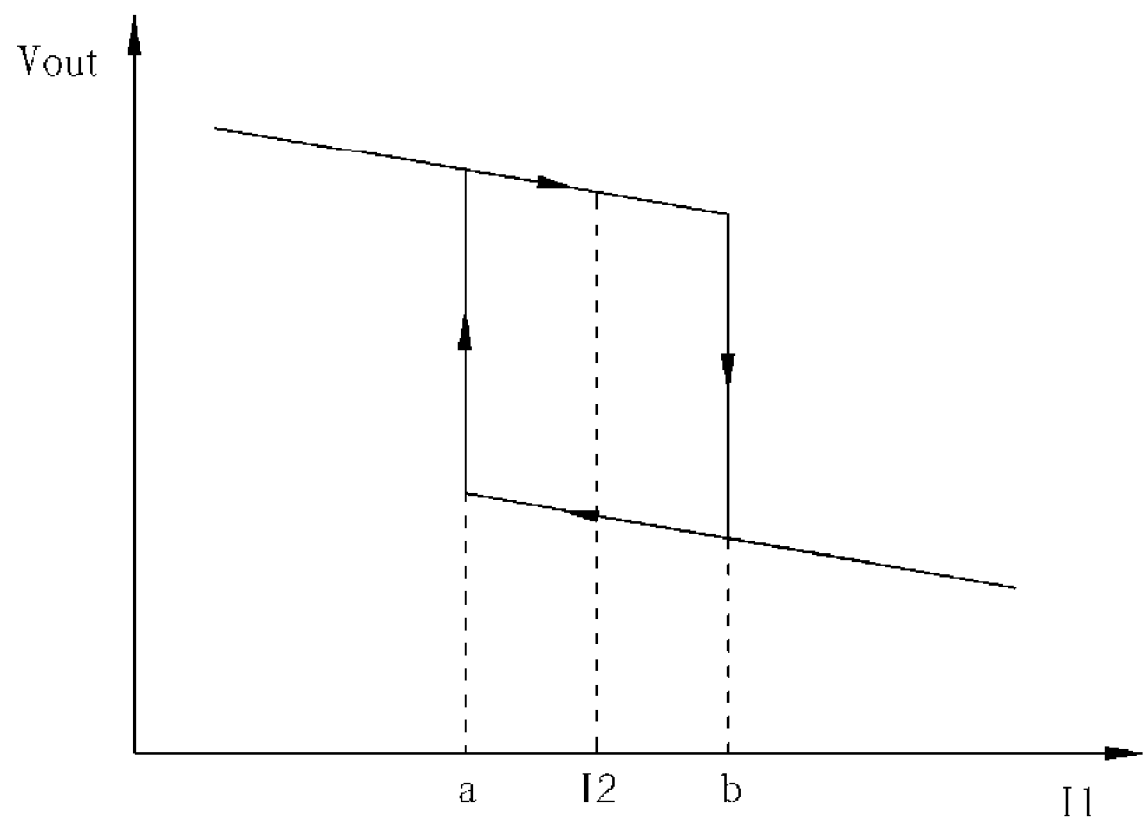
FIG. 2 is a graph of current vs. voltage for the circuitry of FIG. 1.
Figure 3:
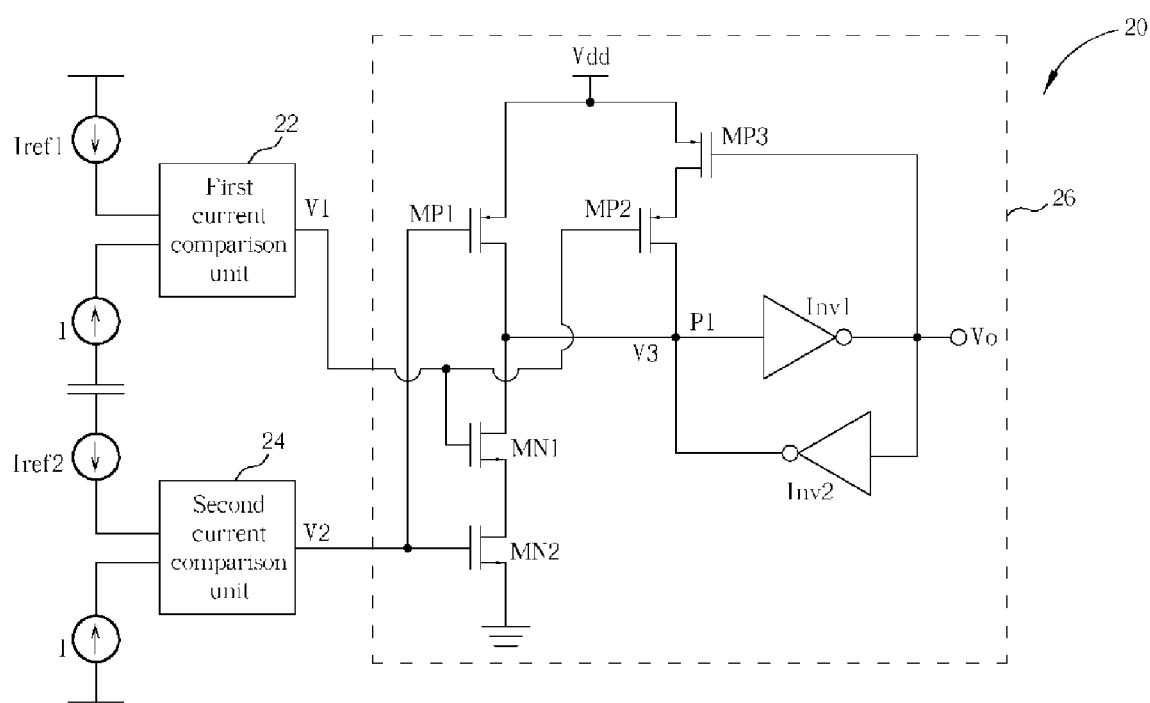
FIG. 3 shows circuitry of a hysteresis current comparator according to the present invention.

Please refer to FIG. 3, which shows circuitry of a hysteresis current comparator 20 according to the present invention. The current comparator 20 comprises a first current comparison unit 22, a second current comparison unit 24, and a control circuit 26. The control circuit 26 includes two NMOS transistors MN1 and MN2, three PMOS transistors MP1, MP2 and MP3, and two inverters Inv1 and Inv2.

As shown in FIG. 3, the control circuit 26 includes the first NMOS transistor MN1 having a gate connected to an output V1 of the first current comparison unit 22 and a drain connected to a first node P1; the second NMOS transistor MN2 having a gate connected to an output V2 of the second current comparison unit 24, a drain connected to a source of the first NMOS transistor MN1, and a source connected to ground; the first PMOS transistor MP1 having a gate connected to the output V2 of the second current comparison unit 24, a drain connected to the first node P1, and a source connected to a voltage source Vdd; the second PMOS transistor MP2 having a gate connected to the output V1 of the first current comparison unit 22, and a drain connected to the first node P1; and the third PMOS transistor MP3 having a drain connected to the source of the second PMOS transistor MP2, a source connected to the voltage source Vdd, and a gate connected to the output Vo of the control circuit 26. The control circuit 26 further includes the first inverter Inv1 having an input connected to the first node P1 and an output connected to the output Vo of the control circuit 26, and the second inverter Inv2 having an input connected to the output Vo of the control circuit 26 and an output connected to the first node P1.

The functionality of the first current comparison unit 22 and the second current comparison unit 24 is the same, receiving an input current I and a reference current (such as Iref1 or Iref2), comparing the two received currents, and outputting a voltage accordingly. For instance, if the input current I is smaller than the reference current Iref1, a first voltage V1 output from the first current comparison unit 22 is high. On the contrary, if the input current I is higher than the reference current Iref1, the first voltage V1 is low. The operation of the second current comparison unit 24 is the same and description is omitted herein.

The control circuit 26 is connected to the two current comparison units 22 and 24. Transistors MN1 and MP2 are controlled by the first voltage V1 output from the first current comparison unit 22. When the first voltage is high, transistor MN1 is turned on. When the first voltage is low, transistor MP2 is turned on. Similarly, the second voltage V2 output from the second current comparison unit 24 controls transistors MN2 and MP1. When the second voltage V2 is high, transistor MN2 is turned on. When the second voltage is low, transistor MP1 is turned on. The output voltage Vo output from the control circuit 26 controls transistor MP3. The operation of the current comparator 20 is described later.

Figure 4:
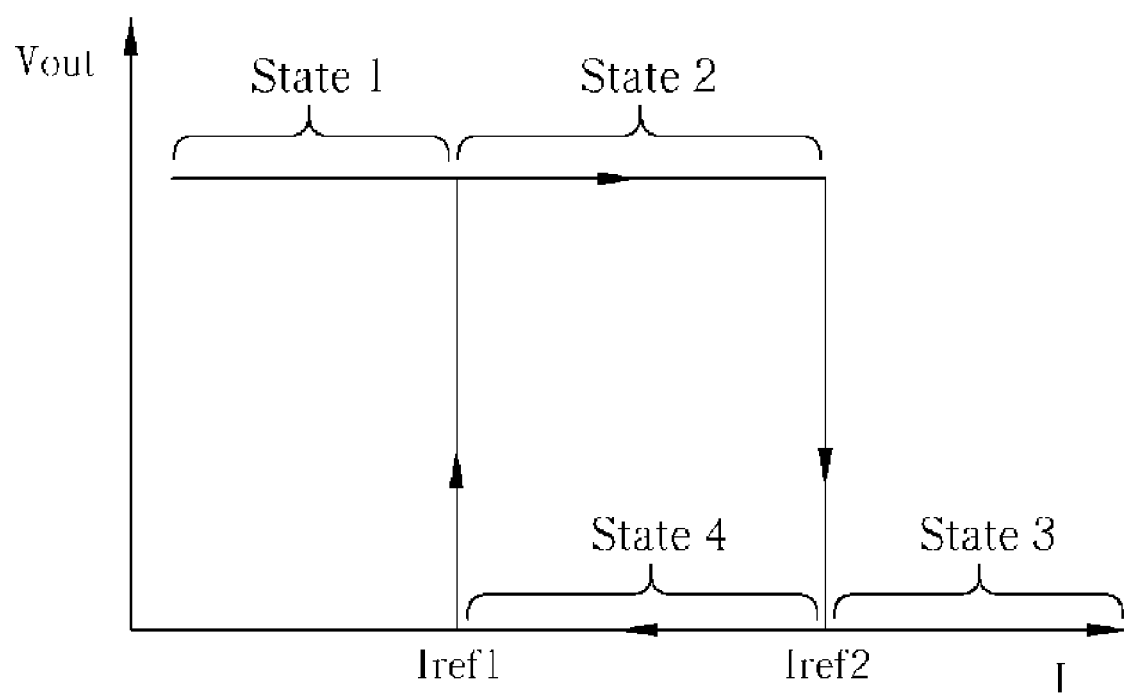
FIG. 4 is a graph of current vs. voltage for the circuitry of FIG. 3.

First, we discuss the situation in which the input current I is increased from a small current to a large current. Please refer to FIG. 4 and FIG. 5. FIG. 4 is a graph of current vs. voltage of the circuit of FIG. 3. FIG. 5 is a table of voltages of FIG. 3. Suppose that the first reference current Iref1 is smaller than the second reference current Iref2. When the input current I is smaller than both the first and second reference currents Iref1 and Iref2, the output voltages V1 and V2 of the two current comparison units 22 and 24 are high and thereby turn on transistors MN1 and MN2. The voltage V3 at the first node 1 is low because transistors MN1 and MN2 are turned on. The voltage V3 is input into the first inverter Inv1 and thereby causes the output voltage Vo to rise to a high level, such as state 1 of FIG. 4 and FIG. 5. Note that transistor MP3 is turned off due to the output voltage Vo being at a high level.

Next, when the input current I is within the range of the first and second reference currents Iref1 and Iref2, that is higher than the first reference current Iref1 and smaller than the second reference current Iref2, the voltage V1 drops to a low level and the voltage V2 remains at a high level, such that transistors MP2 and MN2 are turned on while transistors MN1, MP1, and MP3 are turned off. Although transistor MN2 is turned on, transistor MN1 is turned off and thereby cause the voltage V3 not to be connected to ground. Furthermore, the voltage V3 is not connected to the voltage source Vdd, either. That is because transistor MP2 is turned on and transistors MP1 and MP3 are turned off. Therefore, at this moment, the voltage V3 should be at the former state, the low level. The output voltage Vo of the control circuit 26 is still high. As mentioned above, the voltage V3 is not connected to ground, and neither to the voltage source Vdd. Thus, the voltage V3 is floating. For this issue, the inverter Inv2 is used to prevent the voltage V3 from floating. That is, the inverter Inv2 is used to make sure that the voltage V3 is always opposite to the output voltage Vo. At this moment, each voltage state is shown as the state 2 in FIG. 4 and FIG. 5.

When the input current I is higher than both the first and second reference currents Iref1 and Iref2, the voltages V1 and V2 are both at a low level and turning on transistors MP1 and MP2, however, the transistor MP3 is still turned off due to the output voltage Vo being high. When transistor MP1 is turned on, the voltage V3 is connected to the voltage source Vdd, transferring the voltage V3 to high level. Simultaneously, the output voltage Vo of the control circuit 26 is transferred from high level to low level. At this moment, each voltage state is state 3 in FIG. 4 and FIG. 5. In addition, transistor MP3 is turned on because the output voltage Vo is transferred to low level.

Now we discuss the situation in which the input current I is decreased from a large current to a small current. When the input current I is larger than both the first and second reference currents Iref1 and Iref2, the voltages V1 and V2 are at low a level. The voltage V3 is at high level and the output voltage Vo is at low level because transistor MP1 is turned on, as shown in state 3 in FIG. 4 and FIG. 5. Note that at this moment transistor MP3 is turned on and thereby the output voltage Vo is low.

Next, if the input current I is smaller than the second reference current Iref2, but larger than the first reference current Iref1, the voltage V1 is still low while the voltage V2 is transferred to high level thereby turning on transistor MP2 and turning off transistor MP1. Transistor MP3 is still turned on at this moment and causes the voltage V3 to stay at the former state, the high level, by turning transistors MP2 and MP3 on and thereby connecting the voltage V3 to the voltage source Vdd. This state is shown as state 4 in FIG. 4 and FIG. 5.

When the input current I is smaller than both the first and second reference currents Iref1 and Iref2, the voltages V1 and V2 are high. The voltage V3 is connected to ground by turning transistors MN1 and MN2 on. At this moment, the output voltage Vo is transferred from low to high. This state is state 1 in FIG. 4 and FIG. 5.

From the discussion mentioned above, the control circuit 26 generates an output voltage Vo according to the first voltage V1 of the first current comparison unit 22 and the second voltage V2 of the second current comparison unit 24, or generates an output voltage Vo according to the first voltage V1 of the first current comparison unit 22, the second voltage V2 of the second current comparison unit 24, and the output voltage Vo of the control circuit 26 at the former state.

Compared to the prior art, the present invention utilizes two reference currents Iref1 and Iref2 of the two current comparison units 22 and 24 to define the transition points Iref1 and Iref2 in FIG. 4. Next, the present invention integrates a logic circuit (such as the control circuit 26) to make the hysteresis current comparator 20. When the input current I is increased from small to large current and is larger than the reference current Iref2, the output voltage Vo decreases from high to low at the transition point Iref2. Conversely, when the input current I is decreased from large to small current and is smaller than the reference current Iref1, the output voltage Vo increases from low to high at the transition point Iref1. The current comparator 20 of the present invention uses the same type of current source for the input current I and the reference currents Iref1 and Iref2. For instance, these current sources are made of PMOS components. Due to the same type of current source, the layouts and characteristics of the three current sources are similar. The relation for these three sources is well controlled under process variation. Thus, the present invention provides for a better hysteresis curve than the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hysteresis current comparator comprising:
   a first current comparison unit for comparing a first reference current with an input current, and outputting a first voltage accordingly;
   a second current comparison unit for comparing a second reference current with the input current, and outputting a second voltage accordingly; and
   a control circuit connected to the first and second current comparison units for generating an output voltage according to the first and second voltages, or generating an output voltage according to the first and second voltages and the output voltage of the control circuit at a former state, the control circuit comprising:
   a first NMOS transistor having a gate connected to the output of the first current comparison unit, a drain connected to a first node, and a source;
   a second NMOS transistor having a gate connected to the output of the second current comparison unit, a drain connected to the source of the first NMOS transistor, and a source connected to ground;
   a first PMOS transistor having a gate connected to the output of the second current comparison unit, a drain connected to the first node, and a source connected to a voltage source;
   a second PMOS transistor having a gate connected to the output of the first current comparison unit, a drain connected to the first node, and a source;
   a third PMOS transistor having a drain connected to the source of the second PMOS transistor, a source connected to the voltage source, and a gate connected to the output of the control circuit; and
   a first inverter having an input connected to the first node, and an output connected to the output of the control circuit.

2. The hysteresis current comparator of claim 1 further comprising a second inverter having an input connected to the output of the control circuit, and an output connected to the first node.

* * * * *